United States Patent [19]

Ogino et al.

[11] Patent Number: 5,416,919
[45] Date of Patent: May 16, 1995

[54] SEMICONDUCTOR INTEGRATED CIRCUIT WITH FUNCTIONAL BLOCKS CAPABLE OF BEING INDIVIDUALLY TESTED EXTERNALLY

[75] Inventors: Eiji Ogino; Shigeki Imai; Takeshi Yoshii; Masahiko Wada, all of Nara, Japan

[73] Assignee: Sharp Kabushiki Kaisha, Osaka, Japan

[21] Appl. No.: 996,853

[22] Filed: Dec. 21, 1992

Related U.S. Application Data

[60] Continuation of Ser. No. 779,515, Oct. 18, 1991, abandoned, which is a division of Ser. No. 550,822, Jul. 11, 1990, abandoned.

[30] Foreign Application Priority Data

Jul. 19, 1989 [JP] Japan .................................. 1-187713
Sep. 4, 1989 [JP] Japan .................................. 1-228803

[51] Int. Cl.⁶ ........................ G06F 11/00; G01R 31/28
[52] U.S. Cl. .................................. 395/575; 371/22.1; 371/22.6
[58] Field of Search .................. 371/15.1, 16.1, 22.1, 371/22.6; 364/580, 579; 324/158 R, 73.1; 395/575

[56] References Cited

U.S. PATENT DOCUMENTS

| | | | |
|---|---|---|---|
| 4,701,870 | 10/1987 | Mogi et al. | 364/580 |
| 4,746,855 | 5/1988 | Wrinn | 324/73 R |
| 4,810,958 | 3/1989 | Mogi et al. | 324/73 R |
| 4,951,283 | 8/1990 | Mastrocola et al. | 371/29.5 |
| 4,967,387 | 10/1990 | Shibasaki et al. | 364/580 |
| 4,975,641 | 12/1990 | Tanaka et al. | 324/158 R |
| 4,989,208 | 1/1991 | Akao et al. | 371/18 |
| 5,012,180 | 4/1991 | Dalrymple et al. | 324/73.1 |
| 5,012,185 | 4/1991 | Ohfuji | 324/158 R |

Primary Examiner—Robert W. Beausoliel, Jr.
Assistant Examiner—Ly V. Hua
Attorney, Agent, or Firm—Nixon & Vanderhye

[57] ABSTRACT

A semiconductor integrated circuit which includes a central processing unit, one or more peripheral circuits, one or more external terminals for transferring signals to or from the integrated circuit, and circuits for selecting the central processing unit or one of the peripheral circuits and solely operating the selected one in a test mode. The circuit for selecting includes a test mode control circuit and a signal control circuit. The test mode control circuit generates and supplies control signals in response to test operating signals having particular timings different from those of an actual operating signal inputted through the external terminal in a normal mode. The signal control circuit serves to separate the selected one from the others in a manner to allow the separated one to solely operate in the test mode.

5 Claims, 6 Drawing Sheets

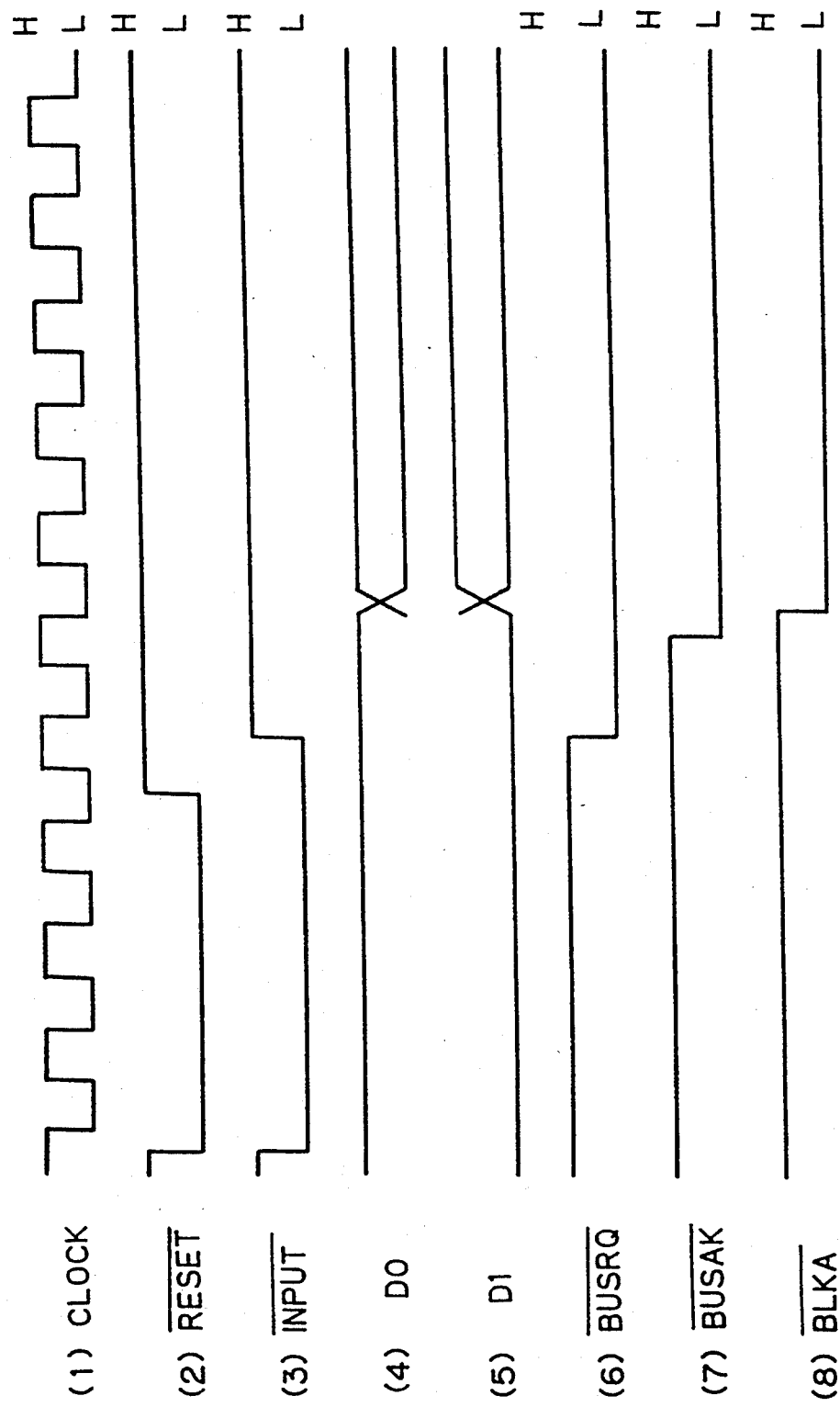

SEMICONDUCTOR INTEGRATED CIRCUIT WITH FUNCTIONAL BLOCKS CAPABLE OF BEING INDIVIDUALLY TESTED EXTERNALLY

This is a continuation of application Ser. No. 07/779,515, filed Oct. 18, 1991, now abandoned, which was a division of Ser. No. 07/550,822, filed Jul. 11, 1990, abandoned.

BACKGROUND OF THE INVENTION

1. Field of the Invention

The present invention relates to a semiconductor integrated circuit and more particularly to a semiconductor integrated circuit which includes a central processing unit for executing an arithmetic processing, peripheral circuits associated with the central processing unit, and a circuit for selecting one of the central processing unit and the peripheral circuits and operating the selected one in a test mode.

2. Description of the Related Art

To produce one device including a central processing unit and one or more peripheral circuits, some prior art employs the steps of integrating a central processing unit and peripheral circuits on independent semiconductor chips and connecting these semiconductor integrated circuits with each other. The term "peripheral circuit" used herein refers to a random access memory, a read-only memory, an input and output interface, and the like. In such prior art the unit and circuits can be easily tested in a test mode, because it is possible to confirm a signal which is inputted in or outputted from the central processing unit from the outside.

To produce one device, on the other hand, other prior art employs the steps of integrating a central processing unit and peripheral circuits on a single semiconductor chip. That is, they are realized as one semiconductor integrated circuit like a large scale integrated circuit (abbreviated as an LSI). Such prior art is often designed to confine a signal which is inputted in or outputted from the central processing unit within the semiconductor chip. It means that it is impossible to confirm the signal from the external side. Therefore, in testing the finished semiconductor integrated circuit, no signal can be inputted in or outputted from the central processing unit without affecting the peripheral circuits. Hence, this prior art has a drawback in that it is substantially impossible to test each one of the central processing unit and the peripheral circuits individually.

To overcome the drawback, external terminals for the operation test have been conventionally added to the device for each peripheral circuit independently of the actually-used external terminals. These added external terminals are used for solely testing the central processing unit and the peripheral circuits.

In such an integrated circuit including the central processing unit and the peripheral circuits integrated on a single semiconductor chip, however, if the number of peripheral circuits are increased for expanding features, there is an increase in the external terminals dedicated to the test operation. The increase of the test-dedicated external terminals causes the outer size of the integrated circuit to expand more than required.

SUMMARY OF THE INVENTION

It is therefore an object of the present invention to provide a semiconductor integrated circuit which can be tested for each one of a central processing unit and associated peripheral circuits thereof without being affected by other elements by provision of only one test-dedicated terminal.

It is another object of the present invention to provide a semiconductor integrated circuit which can be tested for each one of a central processing unit and associated peripheral circuits thereof without being affected by other elements, and does not require any test-dedicated terminal.

The object of the invention can be achieved by a semiconductor integrated circuit comprising:
- a central processing unit for performing arithmetic processings;
- peripheral circuits associated with said unit; and
- a control circuit connected to said unit and said peripheral circuits and having a control terminal, said control circuit separating one of said unit and said peripheral circuits from the others so that said separated one operates solely or interconnecting said unit and said peripheral circuits in order that said unit and said peripheral circuits cooperate with each other in response to a signal supplied from the outside through said control terminal;
- said unit, said peripheral circuits and said control circuit being formed on a single semiconductor chip.

Another object of the invention can be achieved by a semiconductor integrated circuit comprising:
- a central processing unit for performing arithmetic processings;
- peripheral circuits associated with said unit;
- external terminals for communicating with the outside;
- a test mode setting circuit for receiving test signals inputted through said external terminals, and generating control signals in response to said inputted test signals; and
- a signal control circuit connected to said unit, said peripheral circuits and said test mode setting circuit, said signal control circuit separating one of said unit and said peripheral circuits from the others in response to said control signals received from said test mode setting circuit in order that said separated one operates alone.

According to the invention, it is possible to realize a one-chip microprocessor which can be tested for each one of a central processing unit and associated peripheral circuits individually without increasing the outer size of the one-chip microprocessor even if it has many features, because it is not necessary to provide a test-dedicated terminal for each peripheral circuit included in the microprocessor.

Further objects and advantages of the present invention will be apparent from the following description of the preferred embodiments of the invention as illustrated in the accompanying drawings.

BRIEF DESCRIPTION OF THE DRAWINGS

FIG. 7 is a timing chart for explaining an operation of the integrated circuit of FIG. 3 at the time of testing peripheral circuits included in the integrated circuit.

DESCRIPTION OF THE PREFERRED EMBODIMENTS

Figure 1:
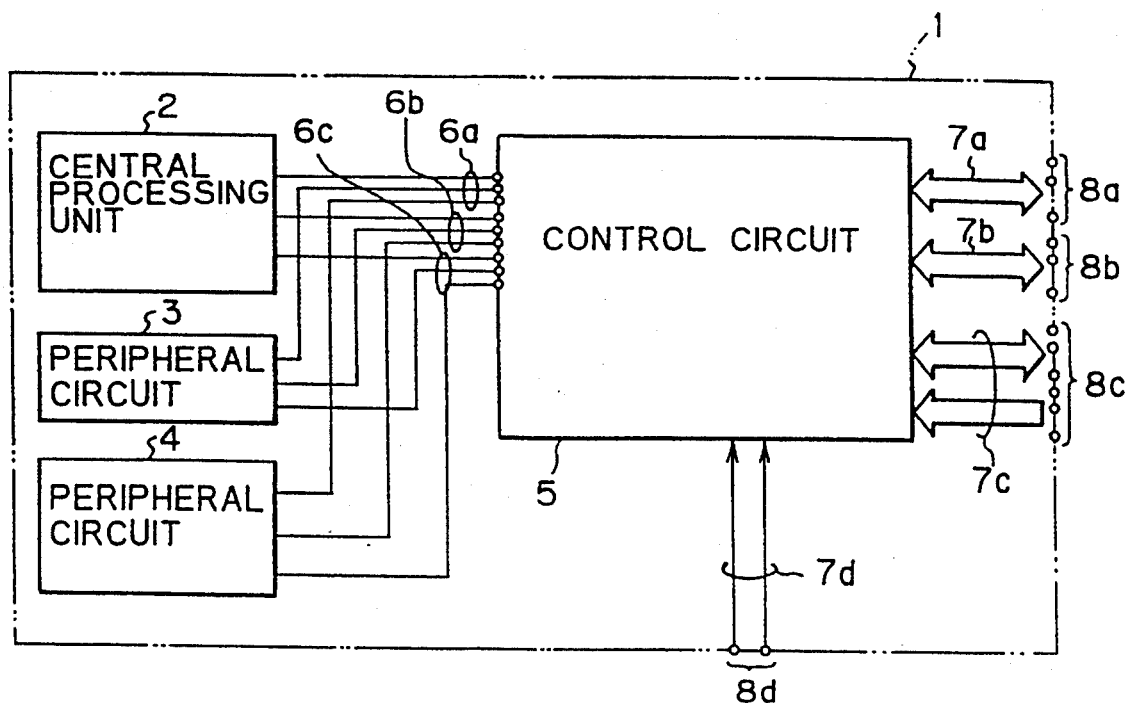
FIG. 1 is a block diagram of an integrated circuit according to an embodiment of the invention.

FIG. 1 is a block diagram of a semiconductor integrated circuit 1 formed on a single semiconductor chip according to an embodiment of the invention. Within the semiconductor integrated circuit 1 are formed a central processing unit 2 (abbreviated as a CPU 2), peripheral circuits 3, 4, and a control circuit 5 by which this embodiment is characterized. The CPU 2 and the peripheral circuits 3, 4 are connected to the control circuit 5 through an internal address bus 6a, an internal data bus 6b and an internal control signal bus 6c. And, the control circuit 5 has an address bus 7a, a data bus 7b and a control signal bus 7c connected thereto. These buses 7a, 7b, 7c are respectively connected to external terminals 8a, 8b, and 8c. Further, the control circuit 5 has a test signal line 7d connected thereto. This test signal line 7d is connected to a control terminal 8d to which a test signal for specifying one out of a plurality of test operations is applied from the external.

Figure 2:
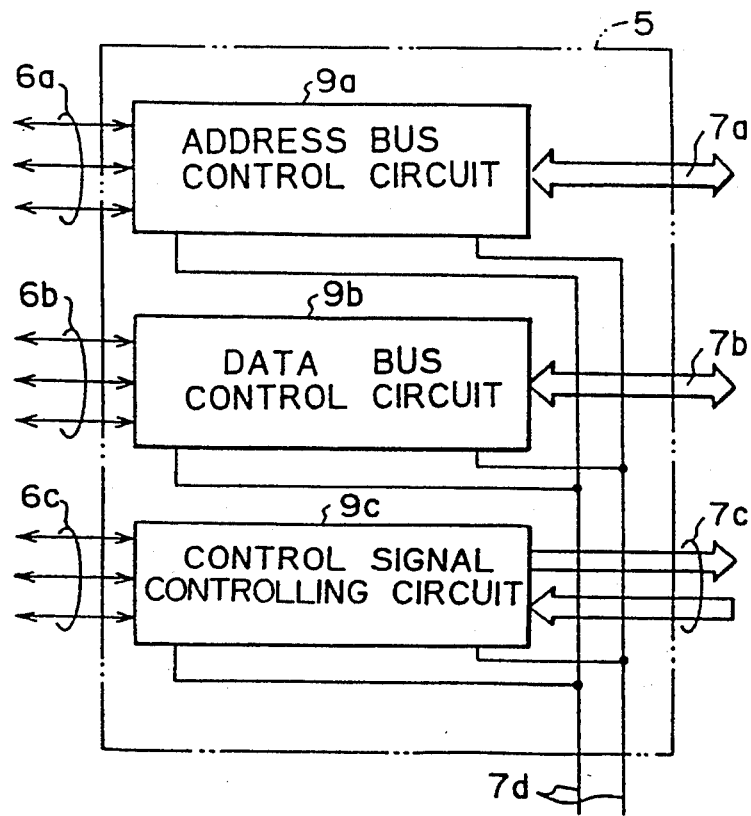
FIG. 2 is a block diagram of a control circuit included in the integrated circuit of FIG. 1.

FIG. 2 is a block diagram of the control circuit 5. The control circuit 5 comprises an address bus control circuit 9a connected to the internal address bus 6a and the address bus 7a, a data bus control circuit 9b connected to the internal data bus 6b and the data bus 7b, and a control signal controlling circuit 9c connected to the internal control signal bus 6c and the control signal bus 7c. These circuits 9a, 9b, 9c receive through the test signal line 7d a test control signal corresponding to a selected test operation from the outside.

To test the central processing unit 2 formed in the semiconductor integrated circuit 1, at first, it is necessary to apply the test control signal corresponding to the selected test operation to the control terminal 8d, and to supply an address signal, a data signal, and a control signal from the external terminals 8a, 8b, 8c to the central processing unit 2 through the buses 7a, 7b, 7c and the internal buses 6a, 6b, 6c. Then, in response to the signal sent through the test signal line 7d, the data bus control circuit 9b and the control signal controlling circuit 9c remain inactive. However, the central processing unit 2 processes the signals supplied from the terminals 8a, 8b, 8c and returns the resulting signals to the terminals 8a, 8b, 8c through the internal buses 6a, 6b, 6c, the circuits 9a, 9b, 9c and the buses 7a, 7b, 7c. Hence, it is possible to determine if the central processing unit 2 operates normally from the outside.

With the similar operation, it is possible to operate the peripheral circuits 3 and 4 independently of the central processing unit 2 for determining if they operate normally.

To set the central processing unit 2 and the peripheral circuits 3, 4 in normal mode, a signal different from the test control signal is supplied from the control terminal 8d to the control circuit 5, whereby the address bus control circuit 9a, the data bus control circuit 9b, and the control signal controlling circuit 9c interconnect the central processing unit 2 with the peripheral circuits 3 and 4 in order that the central processing unit 2 and the peripheral circuits 3, 4 cooperate for executing a desired arithmetic processing. The terminals 8a, 8b, 8c, 8d may be an input-only terminal, an output-only terminal or an input and output terminal. Further, an additional circuit may be mounted on the semiconductor integrated circuit 1.

As mentioned above, the central processing unit 2 and the peripheral circuits 3, 4 are allowed to solely operate in the test mode without causing any adverse effect on the operation between them. It is therefore possible to observe an incidence of faults for each of the unit 2 and circuits 3 and 4 and improve reliability of the semiconductor integrated circuit 1.

The peripheral circuits 3, 4 may comprise a random access memory, a read-only memory, an input and output interface, or any other circuit which can operate with the central processing unit 2.

Figure 3:
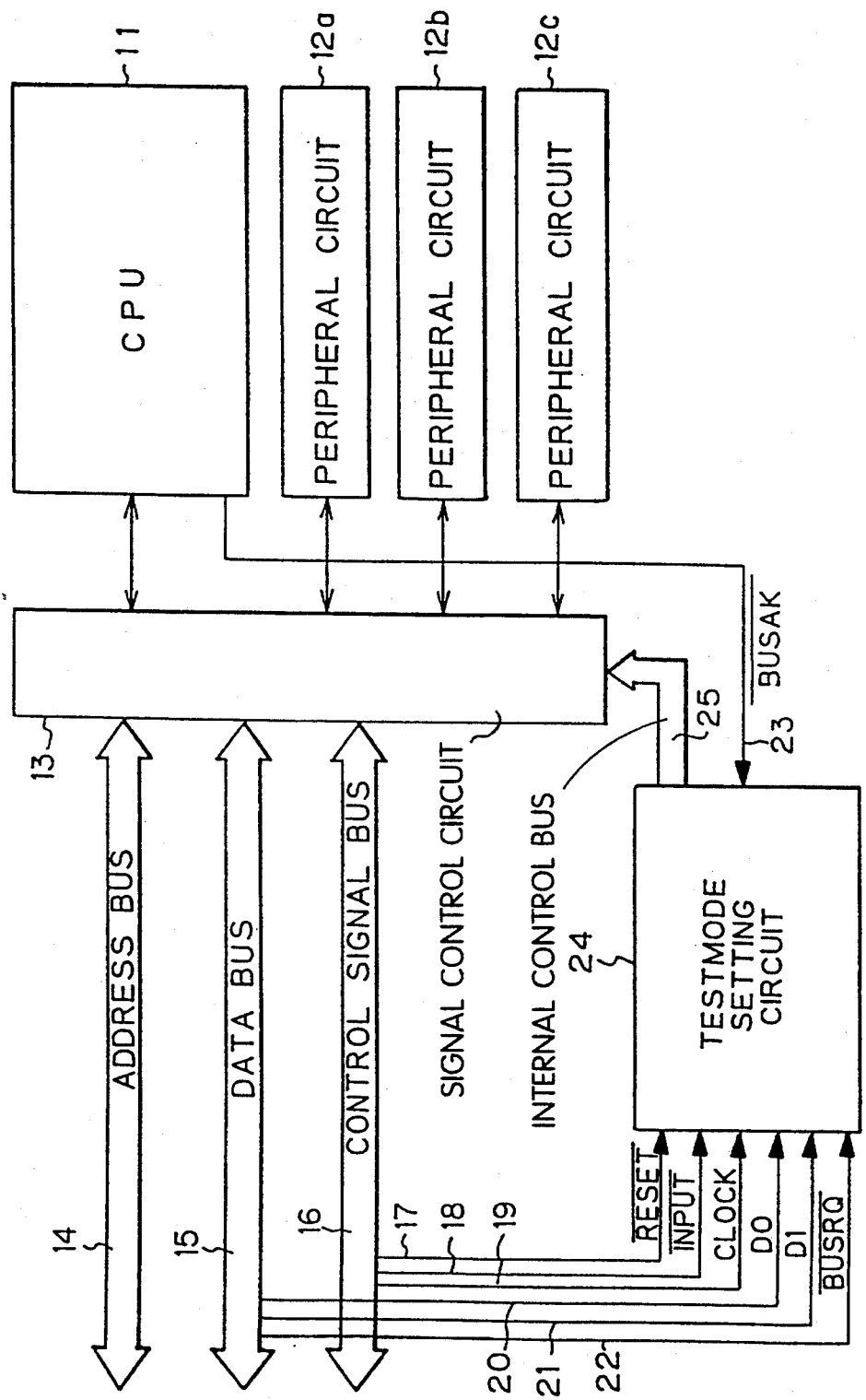
FIG. 3 is a block diagram of an integrated circuit according to the other embodiment of the invention.

Next, the other embodiment of the invention will be described. FIG. 3 is a block diagram of an integrated circuit according to this embodiment. This integrated circuit includes a central processing unit 11 (abbreviated as a CPU 11) for executing arithmetic processing and three peripheral circuits 12a, 12b, 12c which operate with the CPU 11, all of which are formed on a single semiconductor chip. It further includes external terminals (not shown) for transferring a signal to or from the external side.

The CPU 11 and the peripheral circuits 12a to 12c are connected to an address bus 14, a data bus 15, and a control signal bus 16 through a signal control circuit 13 for changing directions and destinations of signals received. These buses 14 to 16 are respectively connected to the external terminals.

The data bus 15 has signal lines 20, 21, 22, the control signal bus 16 has signal lines 17, 18, 19, and the CPU 11 has a signal line 23 for transferring a bus acknowledge signal $\overline{BUSAK}$. These signal lines 17 to 23 are all connected to a test mode setting circuit 24 which receives test signals having particular timings such as a reset signal $\overline{RESET}$, an input signal $\overline{INPUT}$, a single-phase clock signal CLOCK, condition setting signals D0, D1, a bus request signal $\overline{BUSRQ}$ through these lines and supplies a control signal in response to the test signal.

The test mode setting circuit 24 is connected to the signal control circuit 13 through an internal bus 25. The signal control circuit 13 receives the control signal from the test mode setting circuit 24. In response to the control signal, the circuit 13 separates one of the CPU 11 and the peripheral circuits 12a to 12c from the others and changes directions and destinations of signals received so that the separated circuit can be solely tested.

Figure 4:
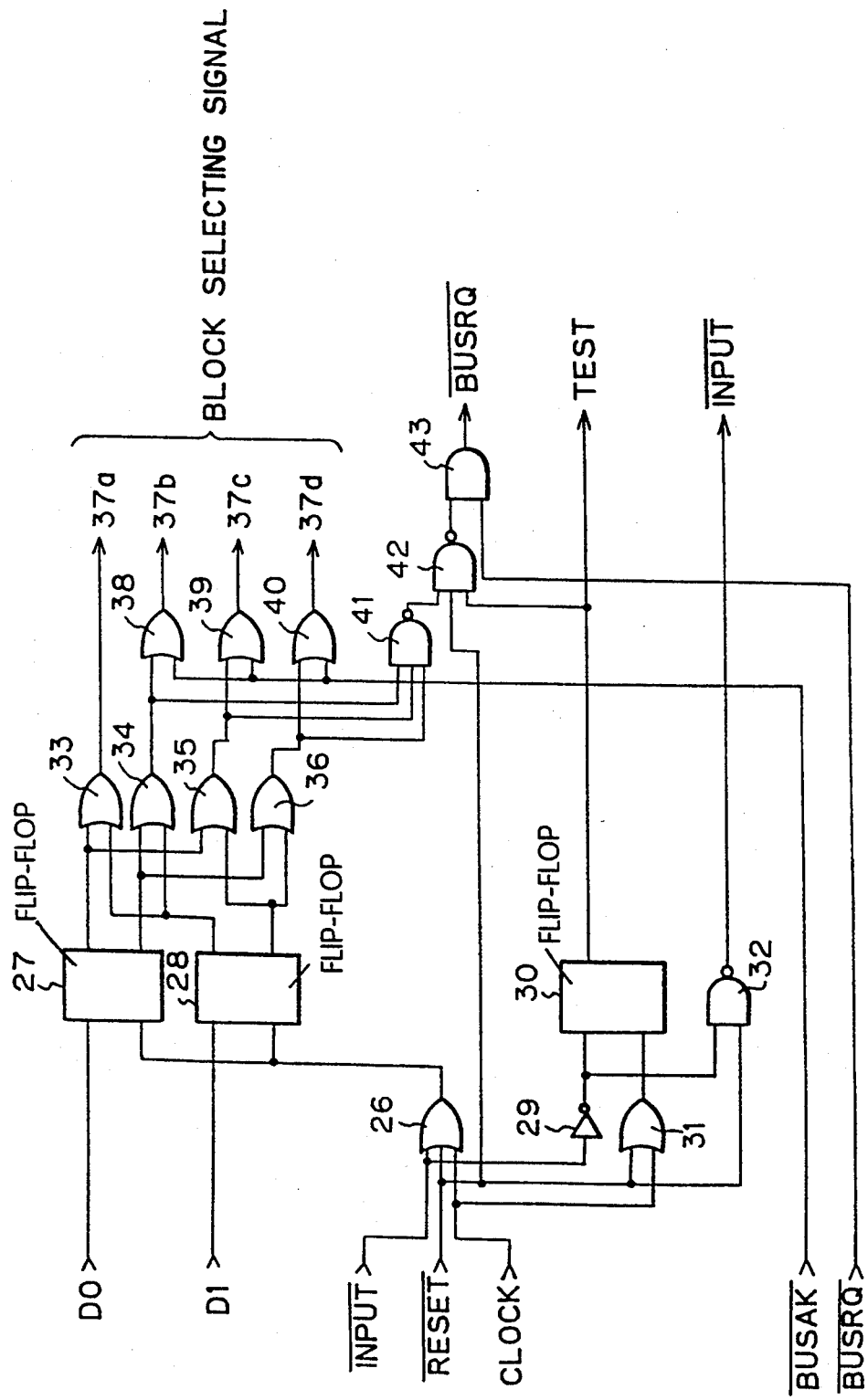
FIG. 4 is a circuit diagram of a test mode setting circuit included in the integrated circuit of FIG. 3.

FIG. 4 is a circuit diagram of the test mode setting circuit 24. In FIG. 4, 26 denotes an OR gate, which has three inputs for receiving the input signal $\overline{INPUT}$, the reset signal $\overline{RESET}$, and the single-phase clock signal CLOCK for setting the test mode. The OR gate 26 serves to perform an OR operation of these signals. When the input signal $\overline{INPUT}$ and the reset signal $\overline{RESET}$ are active, the OR gate 26 pass the signal-phase clock signal CLOCK.

27 and 28 denote D flip-flops. They are circuits for respectively holding 2-bit condition setting signals D0, D1, which are used for selecting any one from the CPU 1 and the peripheral circuits 12a to 12c so that the selected circuit is allowed to solely operate in the test mode. The clock signal CLOCK allowed to pass through the OR gate 26 is effective as clocks of the D flip-flops 27, 28.

29 denotes an inverter and 30 denotes a D flip-flop. The inverter 29 serves to invert the input signal $\overline{\text{INPUT}}$. The D flip-flop 30 holds the inverted signal as a test signal TEST indicative of the test mode being set.

31 denotes an OR gate, which has two inputs for receiving the reset signal $\overline{\text{RESET}}$ and the clock signal CLOCK. The OR gate 31 serves to perform an OR operation of these signals. When the reset signal $\overline{\text{RESET}}$ is active, the clock signal CLOCK is allowed to pass through the OR gate 31 and is effective as clocks of the D flip-flop 30.

32 denotes a NAND gate, which has two inputs for receiving an inverted signal of the input signal $\overline{\text{INPUT}}$ and the reset signal $\overline{\text{RESET}}$. The NAND gate 32 serves to perform a NAND operation of these signals. When the reset signal $\overline{\text{RESET}}$ is inactive, the input signal $\overline{\text{INPUT}}$ can pass through the NAND gate 32.

33, 34, 35 and 36 denote OR gates, which serve to generate block selecting signals 37a to 37d in response to non-inverted outputs and inverted outputs of the D flip-flops 27, 28. The block selecting signals are signals for selecting one of the CPU 11 and the peripheral circuits 12a to 12c so that the selected circuit is allowed to solely operate in the test mode. The OR gate 33 which has two inputs for receiving non-inverted outputs of the D flip-flops 27 and 28, supplies the block selecting signal 37a for testing the CPU 11. The OR gate 34 which has two inputs for receiving an inverted output of the D flip-flop 27 and the non-inverted output of the D flip-flop 28, generates and supplies the block selecting signal 37b for operating the peripheral circuit 12a in the test mode. The OR gate 35 which has two inputs for receiving the non-inverted output of D flip-flop 28 and an inverted output of the D flip-flop 27, generates and supplies the block selecting signal 37c for operating the peripheral circuit 12b in the test mode. The OR gate 36 which has two inputs for receiving the inverted outputs of the D flip-flops 27 and 28, generates and supplies the block selecting signal 37d for operating the peripheral circuit 12c in the test mode.

The OR gate 38 has two inputs for receiving the block selecting signal 37b and the bus acknowledge signal $\overline{\text{BUSAK}}$. The signal $\overline{\text{BUSAK}}$ is supplied from the CPU 11. The OR gate 38 serves to perform an OR operation of these signals. When the bus acknowledge signal $\overline{\text{BUSAK}}$ is active, the block selecting signal 37b can pass through the OR gate 38.

The OR gate 39 has two inputs for receiving the block selecting signal 37c and the bus acknowledge signal $\overline{\text{BUSAK}}$. The OR gate 39 serves to perform an OR operation of these signals. When the bus acknowledge signal $\overline{\text{BUSAK}}$ is active, the block selecting signal 37c can pass through the OR gate 39.

The OR gate 40 has two inputs for receiving the block selecting signal 37d and the bus acknowledge signal $\overline{\text{BUSAK}}$. The OR gate 40 serves to perform an OR operation of these signals. When the bus acknowledge signal $\overline{\text{BUSAK}}$ is active, the block selecting signal 37d can pass through the OR gate 40.

41 denotes a NAND gate, which has three inputs for receiving the block selecting signals 37b to 37d for operating the peripheral circuits 12a to 12c in the test mode. The NAND gate 41 serves to perform a NAND operation of these signals. To operate the CPU 11 solely in the test mode, these three signals are set at a high level so that the output of the NAND gate 41 stays at a low level.

A NAND gate 42 has three inputs for receiving an output signal of the NAND gate 41, the reset signal $\overline{\text{RESET}}$, and the test signal TEST and serves to perform a NAND operation of these three signals. This gate 42 normally supplies a low-level output signal except the case where the CPU 11 is selected in the test mode (the test signal TEST stays at the high level).

An AND gate 43 has two inputs for receiving an output signal of the NAND gate 42 and the bus request signal $\overline{\text{BUSRQ}}$ and serves to perform an AND operation of these signals. If the CPU 11 is selected in the test mode, an AND gate 43 supplies the bus request signal $\overline{\text{BUSRQ}}$ as it is without any change. If any other circuit except the CPU 11 is selected, the output of the AND gate 43, that is, the bus request signal $\overline{\text{BUSRQ}}$ is made active.

Figure 5:
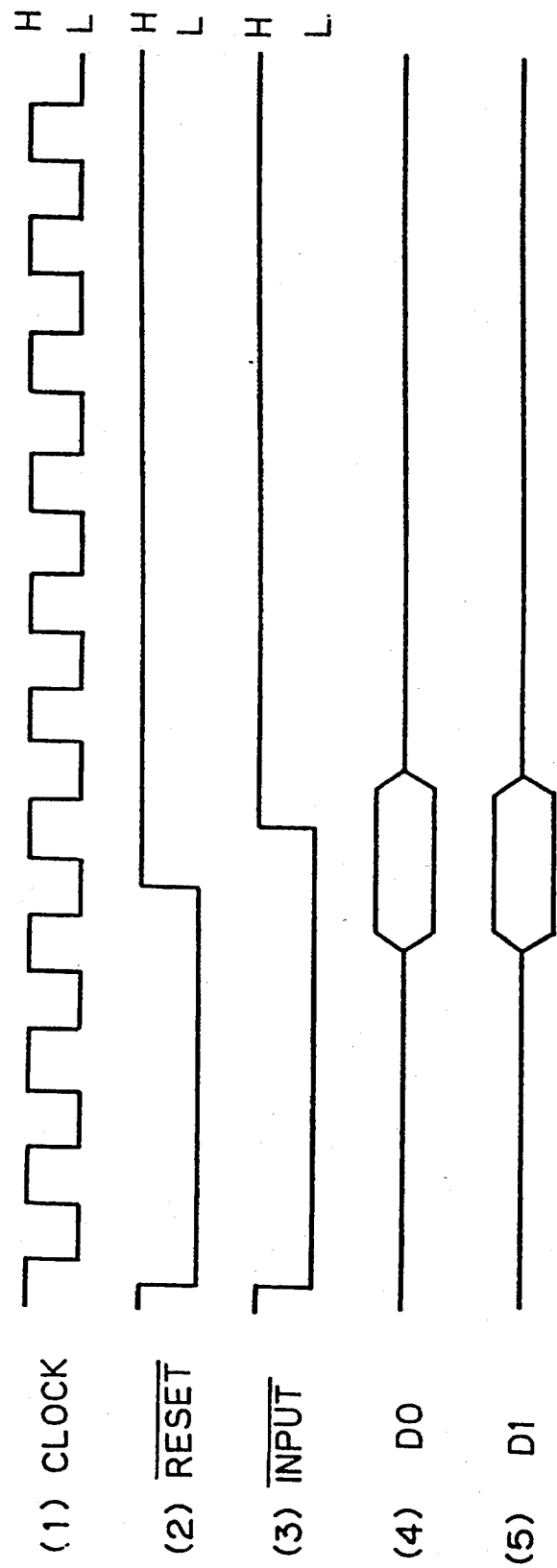
FIG. 5 is a timing chart for explaining an operation of the integrated circuit of FIG. 3 set in a test mode.
Figure 6:
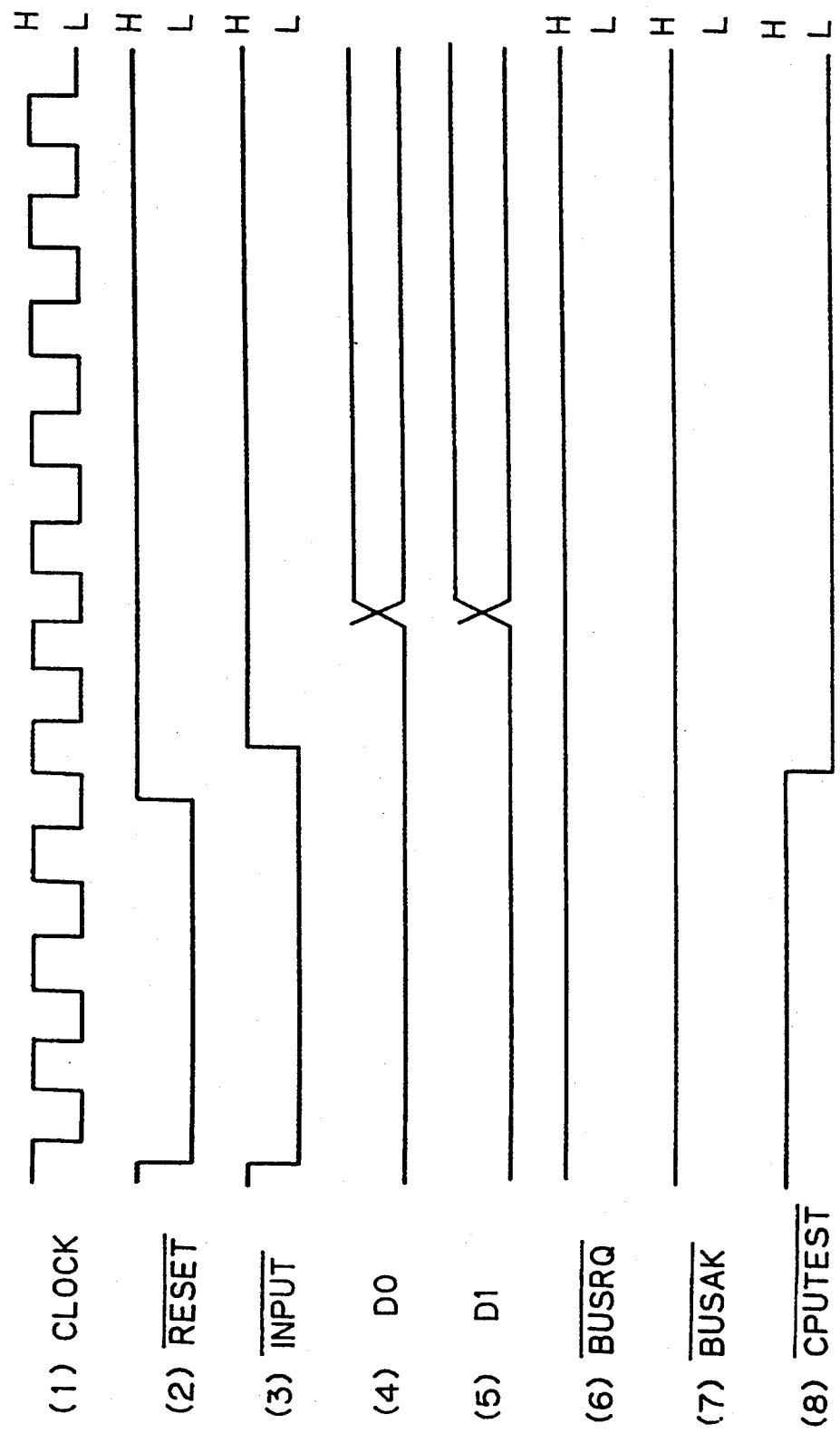
FIG. 6 is a timing chart for explaining an operation of the integrated circuit of FIG. 3 at the time of testing a central processing unit included in the integrated circuit.

FIG. 5 is a timing chart for explaining the operation of the integrated circuit in the test mode. FIG. 6 is a timing chart for explaining the operation of the CPU 11 in the test mode. FIG. 7 is a timing chart for explaining the operations of the peripheral circuits 12a to 12c in the test mode. The test mode operations of the integrated circuit will be described with reference to FIGS. 5 to 7. To start the test mode, by the reset signal $\overline{\text{RESET}}$ (see FIG. 5(2)) and the input signal $\overline{\text{INPUT}}$ (see FIG. (3)) inputted through the external terminal are activated. Then, the condition setting signals D0, D1 (see FIG. 5(4) and (5)) are inputted through the external terminal. The signals D0, D1 are latched in the test mode setting circuit 24 by the clock signal CLOCK (see FIG. 5(1)). Whereby one of the CPU 11 and the peripheral circuits 12a to 12c is allowed to solely operate in the test mode. The block setting signals, used for selecting the unit or circuit to be tested, is supplied from the test mode setting circuit 24 to the signal control circuit 13 in correspondence with the bus request signal $\overline{\text{BUSRQ}}$ inputted through the external terminal and the bus acknowledge signal $\overline{\text{BUSAK}}$ supplied from the CPU 11. It makes the selected circuit to solely operate in the test mode.

Assume that the condition setting signals D0, D1 (see FIG. 6(4) and (5)) specify the CPU 11. In this assumption, when the reset signal $\overline{\text{RESET}}$ (see FIG. 6(2)) rises while the input signal $\overline{\text{INPUT}}$ (see FIG. 6(3)) is made active, the block setting signal $\overline{\text{CPUTEST}}$ (see FIG. 6(8)) specifying the CPU 11 (corresponding to the block setting signal 37a of FIG. 4) is made active and is supplied from the test mode setting circuit 24 to the signal control circuit 13. This circuit 13 allows the CPU 11 to solely operate in the test mode. It means that the CPU 11 is separated from the peripheral circuits 12a to 12c. In this instance, the bus request signal $\overline{\text{BUSRQ}}$ (see FIG. 6(6)), which is supplied from the test mode setting circuit 24 to the CPU 11 via signal control circuit 13 is made inactive (it means that the bus acknowledge signal $\overline{\text{BUSAK}}$ (see FIG. 6(7)) outputted from the CPU 11 is made inactive). At this time, the CPU 11 is electrically connected to the buses 14 to 16 so that it can transfer data to or from the outside.

Further, if the condition setting signals D0, D1 (see FIG. 7(4) and (5)) specify one of the peripheral circuits 12a to 12c, the bus request signal $\overline{\text{BUSRQ}}$ (see FIG. 7(6)), which is supplied from the test mode setting circuit 24 to the CPU 11 via the signal control circuit 13, is made active when the input signal $\overline{\text{INPUT}}$ (see FIG. 7(3)) rises, thereby allowing the CPU 11 to release the buses 14 to 16. In response to the bus request signal $\overline{\text{BUSRQ}}$ being active, the bus acknowledge signal $\overline{\text{BUSAK}}$ (see FIG. 7(7)) supplied from the CPU 11 to the test mode setting circuit 24 is made active. It results in making the block selecting signal $\overline{\text{BLKA}}$ (see FIG. 7(8)) active. The signal $\overline{\text{BLKA}}$ corresponds to the block setting signal 37b of FIG. 4 for example. Then, the signal $\overline{\text{BLKA}}$ is supplied from the test mode setting circuit 24 to the signal control circuit 13. In response to the signal, the signal control circuit 13 allows the selected peripheral circuit (for example, 12a) to solely operate in the test mode. That is, the peripheral circuit 12a is separated from the other circuits.

The above-discussed embodiment is adapted to receive one input signal $\overline{\text{INPUT}}$ and the condition setting signals D0, D1 consisting of two bits. Yet, if the peripheral circuits 12a to 12c included in the integrated circuit increase in number, the condition setting signal may have larger number of bits accordingly. And, if it is desirous to make the timing in setting the test mode more elaborate, the number of the input signal $\overline{\text{INPUT}}$ may be increased.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor integrated circuit formed on a single semiconductor chip and including an address bus, a data bus and a control bus, said semiconductor integrated circuit comprising:

a central processing unit for performing arithmetic processings;

peripheral circuits associated with said central processing unit;

external terminals connected to said address bus, said data bus and said control bus communicating with external devices;

a test mode setting circuit connected to said external terminals for receiving test signals inputted through said external terminals, and generating control signals in response to said inputted test signals; and a signal control circuit connected to said address bus, said data bus and said control bus, said signal control circuit having means for connecting one of said central processing unit and said peripheral circuits to said address bus, said data bus and said control bus in response to said control signals received from said test mode setting circuit for selecting said one of said central processing unit and said peripheral circuits to receive digital signals from said address bus, said data bus and said control bus and to output digital signals to said data bus so that said selected one of said central processing unit and said peripheral circuits operates with said buses.

2. A semiconductor integrated circuit according to claim 1, wherein said test mode setting circuit receives said test signals through said data bus and said control signal bus, and supplies said control signals to said signal control circuit through an internal bus connected between said test mode setting circuit and said signal control circuit.

3. A semiconductor integrated circuit according to claim 1, wherein said central processing unit is responsive to said test signals for producing a bus acknowledgement signal and a selected one of said peripheral circuits is connected to said address bus, said data bus and said control bus when said bus acknowledgement signal is outputted from said central processing unit.

4. A semiconductor integrated circuit according to claim 1, in which said test mode setting circuit generates a signal for preventing the operation of said semiconductor integrated circuit from being changed from a normal mode to a test mode when said test signals are irregular.

5. A semiconductor integrated circuit according to claim 1, wherein said external terminals, said address bus, said data bus, and said control bus are used in both a normal mode and a test mode.

* * * * *

UNITED STATES PATENT AND TRADEMARK OFFICE
CERTIFICATE OF CORRECTION

PATENT NO. : 5,416,919
DATED : May 16, 1995
INVENTOR(S) : EIJI OGINO et al

It is certified that error appears in the above-indentified patent and that said Letters Patent is hereby corrected as shown below:

ON THE TITLE PAGE:

Item [75], the inventors Shigeki Imai and Takeshi Yoshii should be deleted, and item [75] should read as follows:

-- [75] Inventors: Eiji Ogino; Masahiko Wada, both of Nara, Japan --.

Signed and Sealed this

First Day of August, 1995

*Attest:*

BRUCE LEHMAN

*Attesting Officer*     *Commissioner of Patents and Trademarks*